United States Patent
Park et al.

(10) Patent No.: US 9,229,289 B2
(45) Date of Patent: Jan. 5, 2016

(54) ARRAY SUBSTRATE FOR NARROW BEZEL TYPE LIQUID CRYSTAL DISPLAY DEVICE AND METHOD OF MANUFACTURING THE SAME

(71) Applicant: LG Display Co., Ltd., Seoul (KR)

(72) Inventors: Chan-Soo Park, Seoul (KR); Se-Eung Lee, Seoul (KR); Ji-Suk Min, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/094,887

(22) Filed: Dec. 3, 2013

(65) Prior Publication Data

US 2014/0167052 A1  Jun. 19, 2014

(30) Foreign Application Priority Data

Dec. 14, 2012 (KR) .................. 10-2012-0146780

(51) Int. Cl.
*G02F 1/1343* (2006.01)
*H01L 27/12* (2006.01)
*G02F 1/1362* (2006.01)
*G02F 1/1345* (2006.01)
*H05K 1/18* (2006.01)

(52) U.S. Cl.
CPC ........ *G02F 1/136286* (2013.01); *H01L 27/124* (2013.01); *G02F 2001/13456* (2013.01); *G02F 2201/40* (2013.01); *H05K 1/189* (2013.01); *H05K 2201/10128* (2013.01)

(58) Field of Classification Search
CPC ..... H01L 27/12; H01L 27/124; G02F 1/1368; G02F 1/136286
USPC ............................................ 257/59; 349/139
See application file for complete search history.

(56) References Cited

U.S. PATENT DOCUMENTS

2009/0290081 A1* 11/2009 Cho et al. ................... 349/42
2012/0127412 A1* 5/2012 Lee et al. .................... 349/139

* cited by examiner

*Primary Examiner* — Evan Pert
*Assistant Examiner* — Changhyun Yi
(74) *Attorney, Agent, or Firm* — Morgan, Lewis & Bockius LLP

(57) ABSTRACT

An array substrate for a liquid crystal display device and method of manufacturing the same are provided. The array substrate includes: a plurality of paired gate lines at a first distance from each other at a boundary between adjacent first regions on a substrate, including a display area including a plurality of first regions, each including two adjacent pixel regions, a gate insulating layer on the gate lines and including a gate contact hole exposing each of the gate lines, a plurality of data lines crossing the paired gate lines, the first regions located at each crossing, an auxiliary gate line parallel with the data lines and at a boundary between the two adjacent two pixel regions, and a thin film transistor in each of the pixel regions and connected to corresponding gate and data lines, wherein the auxiliary gate line contacts the corresponding gate line through the hole.

14 Claims, 9 Drawing Sheets

ARRAY SUBSTRATE FOR NARROW BEZEL TYPE LIQUID CRYSTAL DISPLAY DEVICE AND METHOD OF MANUFACTURING THE SAME

CROSS-REFERENCE TO RELATED APPLICATION(S)

This application claims the benefit under 35 U.S.C. §119 (a) of Korean Patent Application No. 10-2012-0146780, filed on Dec. 14, 2012, in the Korean Intellectual Property Office, the entire disclosure of which is incorporated by reference herein for all purposes.

BACKGROUND

1. Technical Field

The following description relates to a liquid crystal display device and method, and more particularly, to an array substrate for a liquid crystal display device having a narrow bezel and method of manufacturing the same.

2. Discussion of the Related Art

Recently, liquid crystal display devices (LCD) have attracted attention because it has low power consumption and good portability, and is a technology-intensive and a high-value-added product.

An active matrix type LCD including a thin film transistor (TFT) as a switching element in each of pixels arranged in matrix form is widely used because it has good resolution and a capability of displaying moving images.

Generally, the LCD is manufactured by manufacturing an array substrate and a color filter substrate, and injecting a liquid crystal between the array substrate and the color filter substrate.

Figure 1:
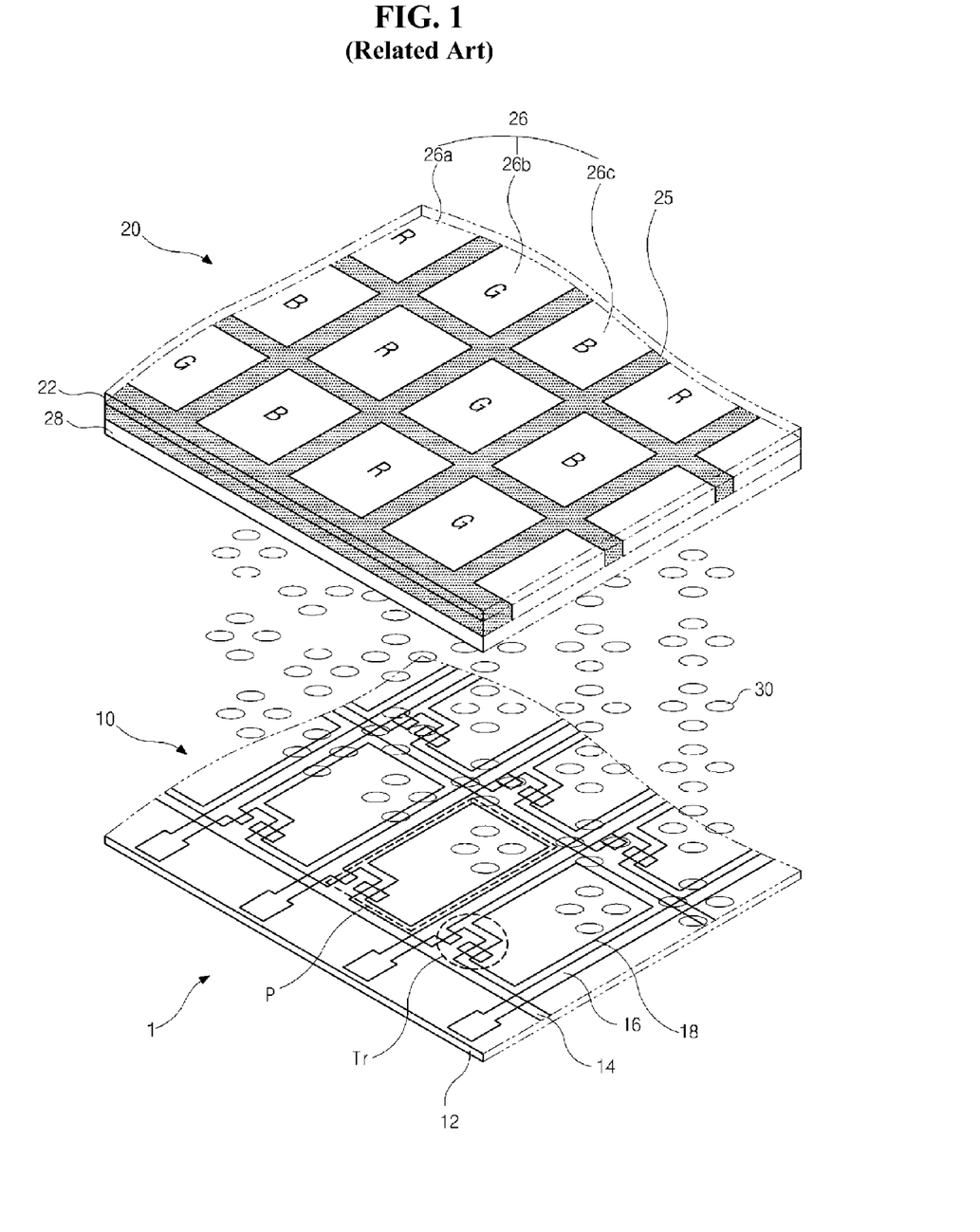
FIG. 1 is an exploded perspective view illustrating a liquid crystal display (LCD) according to a related art.

FIG. 1 is an exploded perspective view illustrating an LCD according to the related art.

With reference to FIG. 1, the LCD 1 includes an array substrate 10 and a color filter substrate 20 with a liquid crystal layer 30 therebetween. The array substrate 10 includes a plurality of gate lines 14 and a plurality of data lines 16 on a transparent substrate 12 to define a plurality of pixel regions P, and a thin film transistor Tr is formed at the crossing portion of the gate lines 14 and data lines 16 and is connected to a pixel electrode 18 in each pixel region P.

The color filter substrate 20 includes a black matrix 25 of lattice shape on a transparent substrate 22 surrounding a boundary of the pixel region P to shield non-display elements such as the gate line 14, the data line 16, and the thin film transistor Tr, a color filter layer 26 including red (R), green (G), and blue (B) color filter layers 26a, 26b, and 26c in respective pixel regions P, and a common electrode 28 on the black matrix 25 and the color filter layer 26.

Even though not shown in the drawings, a sealant is formed between peripheral portions of the array substrate 10 and the color filter substrate 20 to prevent leakage of the liquid crystal layer 30, alignment layers are formed between the array substrate 10 and the liquid crystal layer 30, and between the color filter substrate 20 and the liquid crystal layer 30, respectively, and a polarizing plate is located on least one of outer surfaces of the array substrate 10 and the color filter substrate 20.

A backlight unit (not shown) is located below the array substrate, and a driving portion (not shown) is connected to the array substrate 10 to operate the liquid crystal layer 30.

The driving portion is realized using a printed circuit board (PCB) (not shown). The PCB includes a gate PCB connected to a gate pad that is located at an end of each gate line 14, and a data PCB connected to a data pad that is located at an end of each data line 16.

Figure 2:
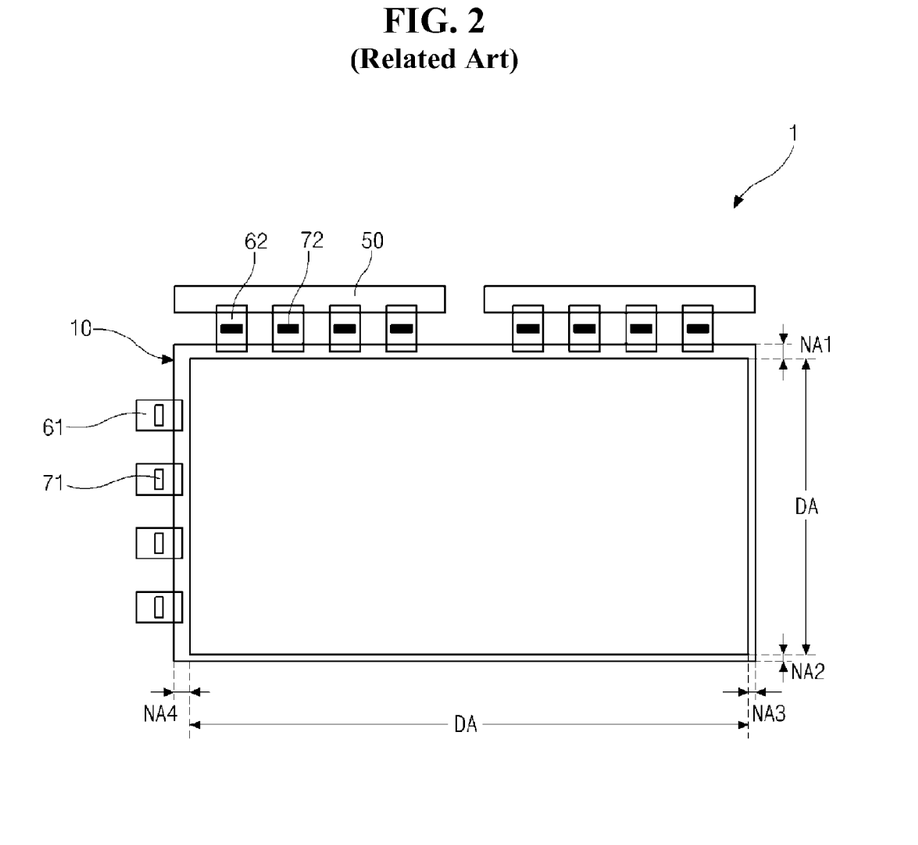
FIG. 2 is a schematic plan view illustrating an LCD including a printed circuit board (PCB) according to the related art.
Figure 3:
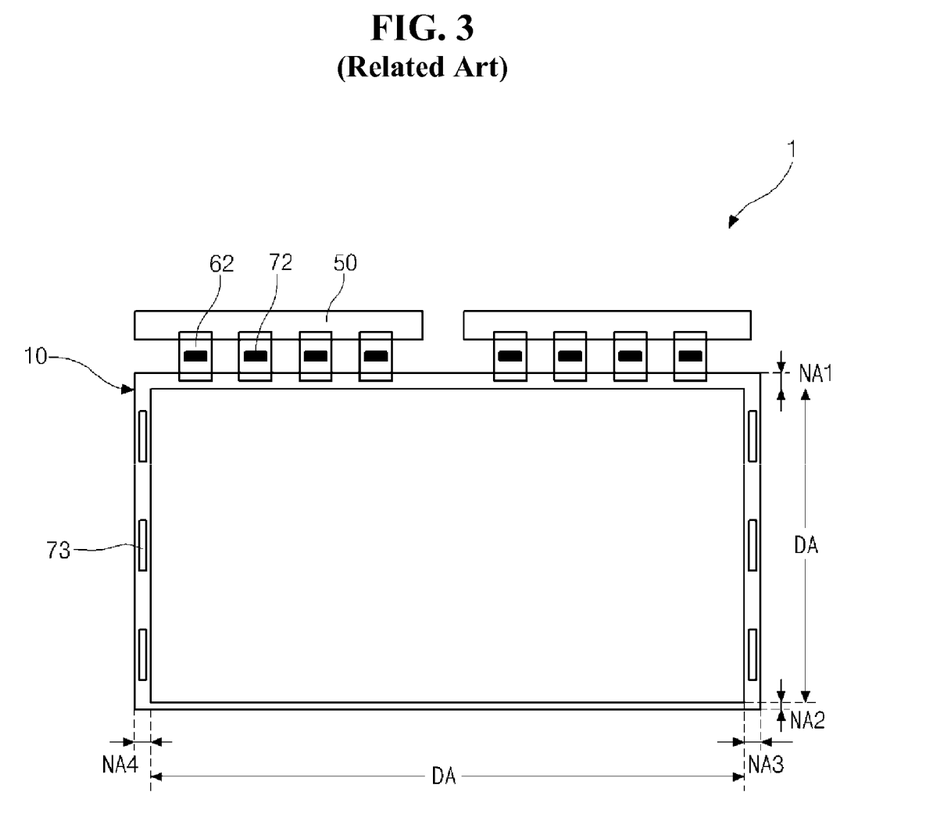
FIG. 3 is a schematic plan view illustrating another LCD including a PCB according to the related art.

FIG. 2 is a schematic plan view illustrating an LCD including a PCB according to the related art. FIG. 3 is a schematic plan view illustrating another LCD including a PCB according to the related art.

With reference to FIG. 2, the array substrate 10 includes a display area DA and a non-display area (NA), which includes first to fourth areas NA1 to NA4 located at a top side, a bottom side, a right side, and a left side, respectively.

The data PCB 50 may be connected to a first or second area NA1 or NA2, and the gate PCB (not shown) may be connected to a third or fourth area NA3 or NA4. For the purpose of explanation, the data PCB 50 is connected to the first area NA1, and no gate PCB is used in FIG. 2. The data PCB 50 and the first area NA1 are connected to each other through data FPCs (flexible printed circuits) 62 including data driving ICs (integrated circuits) 72.

Instead of the gate PCB, gate FPCs 61 including gate driving ICs 71 are connected to the second area NA2, and are electrically connected to the data PCB 50 through signal lines formed at the array substrate 10.

Alternatively, with reference to FIG. 3, the data PCB 50 is connected to the first area NA1 through the data FPC 62, and gate driving ICs 73 are directly formed at the array substrate. This type LCD 1 is referred to as a GIP (gate-in-panel) type LCD.

The LCD as above is widely used for electronic devices, such as a TV, a monitor, a laptop, a mobile phone, a personal digital assistant (PDA), or the like. Recently, there is high demand for such devices having a narrow bezel, and to accomplish this, it is desirable for the LCD to have a narrow non-display area, i.e., a narrow bezel. Particularly, it is desirable for the LCD to have left and right non-display areas minimized.

SUMMARY

Accordingly, embodiments of the present application are directed to an array substrate for an LCD and a method of manufacturing the same which substantially obviates one or more problems due to limitations and disadvantages of the prior art.

An object of embodiments is to provide an array substrate for an LCD that can achieve a narrow bezel, for example, a narrow bezel at left and right sides.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an array substrate for a display device, including: a plurality of paired gate lines spaced at a first distance from each other and each located at a boundary between adjacent first regions on a substrate, the substrate including a display area including a plurality of first regions, each of the first regions including two pixel regions adjacent to each other, a gate insulating layer on the gate lines and including a gate contact hole exposing each of the gate lines, a plurality of data lines crossing the paired gate lines, such that the first regions are located at each crossing, an auxiliary gate line parallel with the data lines and at a boundary between the two adjacent two pixel regions, and a thin film transistor in each of the pixel regions and connected to corresponding gate and data lines, wherein the auxiliary gate line contacts the corresponding gate line through the gate contact hole.

In another aspect, there is provided a method of manufacturing an array substrate for a display device, the method including: a plurality of paired gate lines spaced at a first distance from each other and each located at a boundary between adjacent first regions on a substrate, the substrate including a display area including a plurality of first regions, each of the first regions including two pixel regions adjacent to each other, a gate insulating layer on the gate lines and including a gate contact hole exposing each of the gate lines, a plurality of data lines crossing the paired gate lines, such that the first regions are located at each crossing, an auxiliary gate line parallel with the data lines and at a boundary between the two adjacent two pixel regions, and a thin film transistor in each of the pixel regions and connected to corresponding gate and data lines, wherein the auxiliary gate line contacts the corresponding gate line through the gate contact hole.

It is to be understood that both the foregoing general description and the following detailed description are examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 4:
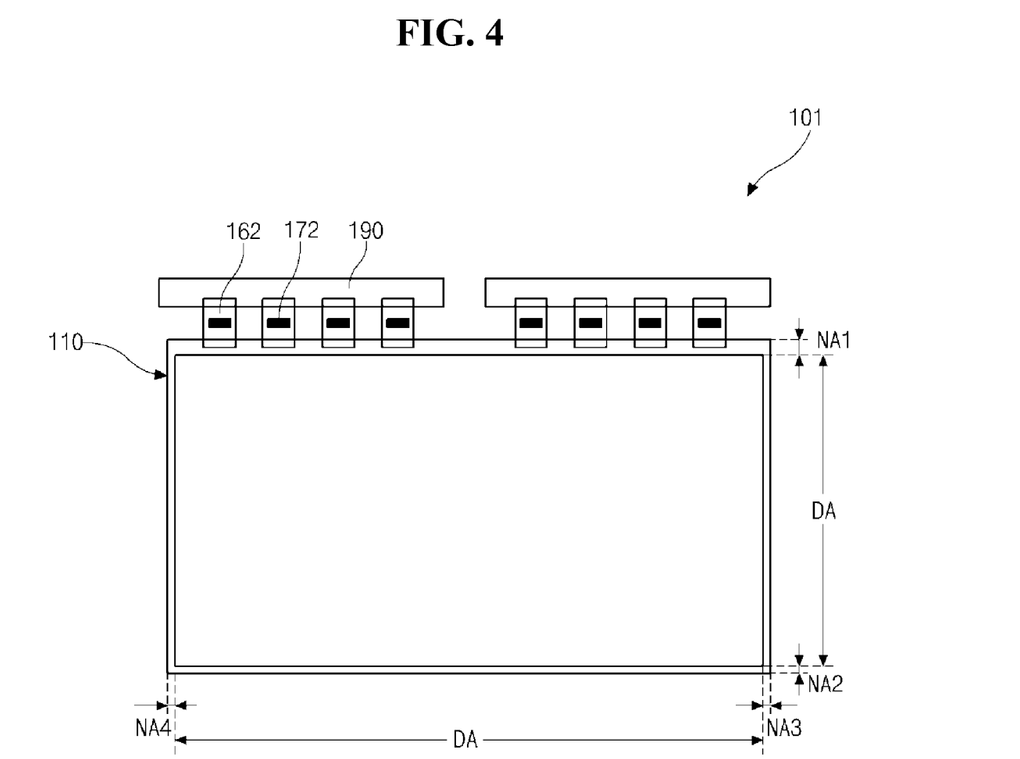
FIG. 4 is a schematic plan view illustrating an LCD including a PCB according to an embodiment.
Figure 5:
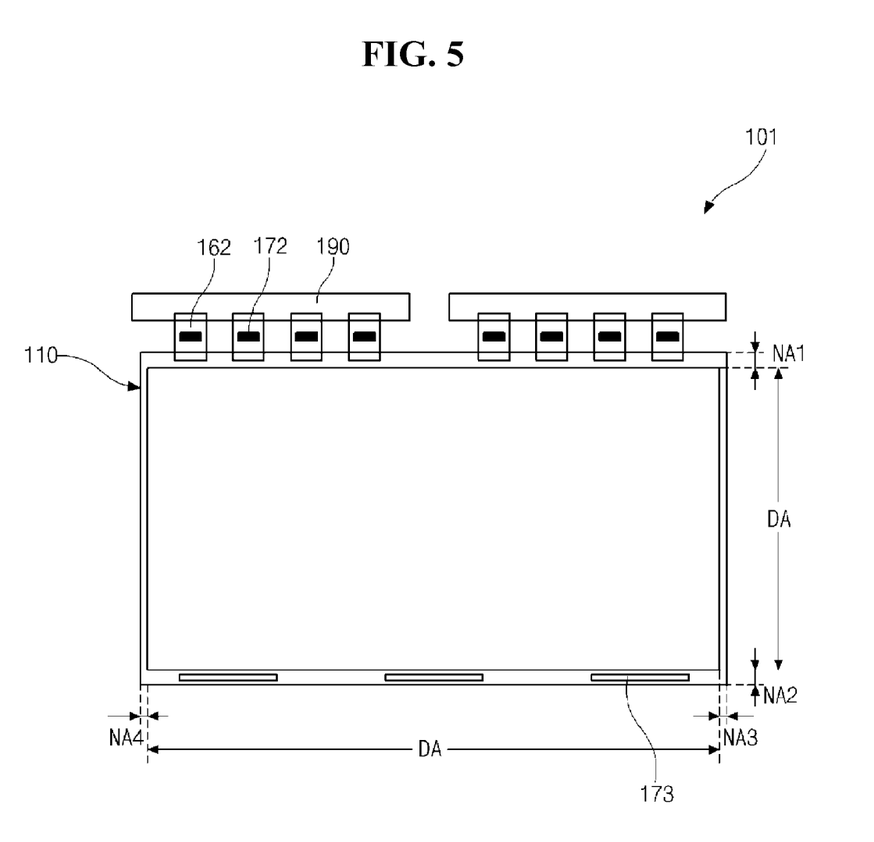
FIG. 5 is a schematic plan view illustrating another LCD including a PCB according to an embodiment.

FIG. 4 is a schematic plan view illustrating a liquid crystal display (LCD) including a PCB according to an embodiment. FIG. 5 is a schematic plan view illustrating another LCD including a PCB according to an embodiment.

With reference to FIG. 4, the array substrate 110 of the LCD 101 may include a display area DA and a non-display area (NA) surrounding the display area DA. The non-display area NA may include first to fourth non-display areas NA1 to NA4 located at a top side, a bottom side, a right side, and a left side, respectively.

A gate driving IC (not shown) may be mounted at the first non-display area NA1, and a PCB 190 may be connected to the first non-display area NA1 through a FPC (flexible printed circuit) 162 having a driving IC (integrated circuit) 172.

Accordingly, because there may be no PCB 190 or driving IC 172 mounted at areas other than the first area NA1, e.g., not mounted in areas NA2 to NA4 among the non-display areas NA1 to NA4, a narrow bezel may be achieved.

Alternatively, with reference to FIG. 5, the PCB 190 may be connected through the FPC 162 to one of the first and second non-display areas NA1, NA2, and a gate driving IC 173 may be formed at the other one of the first and second non-display areas NA1, NA2. For example purposes, the PCB may be connected to the first non-display area NA1, and the gate driving IC 173 may be formed at the second non-display area NA2.

The gate driving IC 173 may be connected to the PCB 190 through auxiliary lines (not shown) formed at one or more of the third and fourth non-display areas NA3, NA4.

In one example, even though the auxiliary lines may be formed at the third and fourth non-display areas NA3, NA4 on the right and left sides, respectively, this may have only a small influence on the narrowness of the bezel of the third and fourth non-display areas NA3, NA4.

In an alternative example, the first and second areas NA1, NA2 may include data pads and gate pads, respectively, and widths of the areas NA1, NA2 may be substantially similar to those of the related art. However, widths of the third and fourth areas NA3, NA4 may be minimized, and a narrow bezel at the left and right sides may be achieved.

Figure 6:
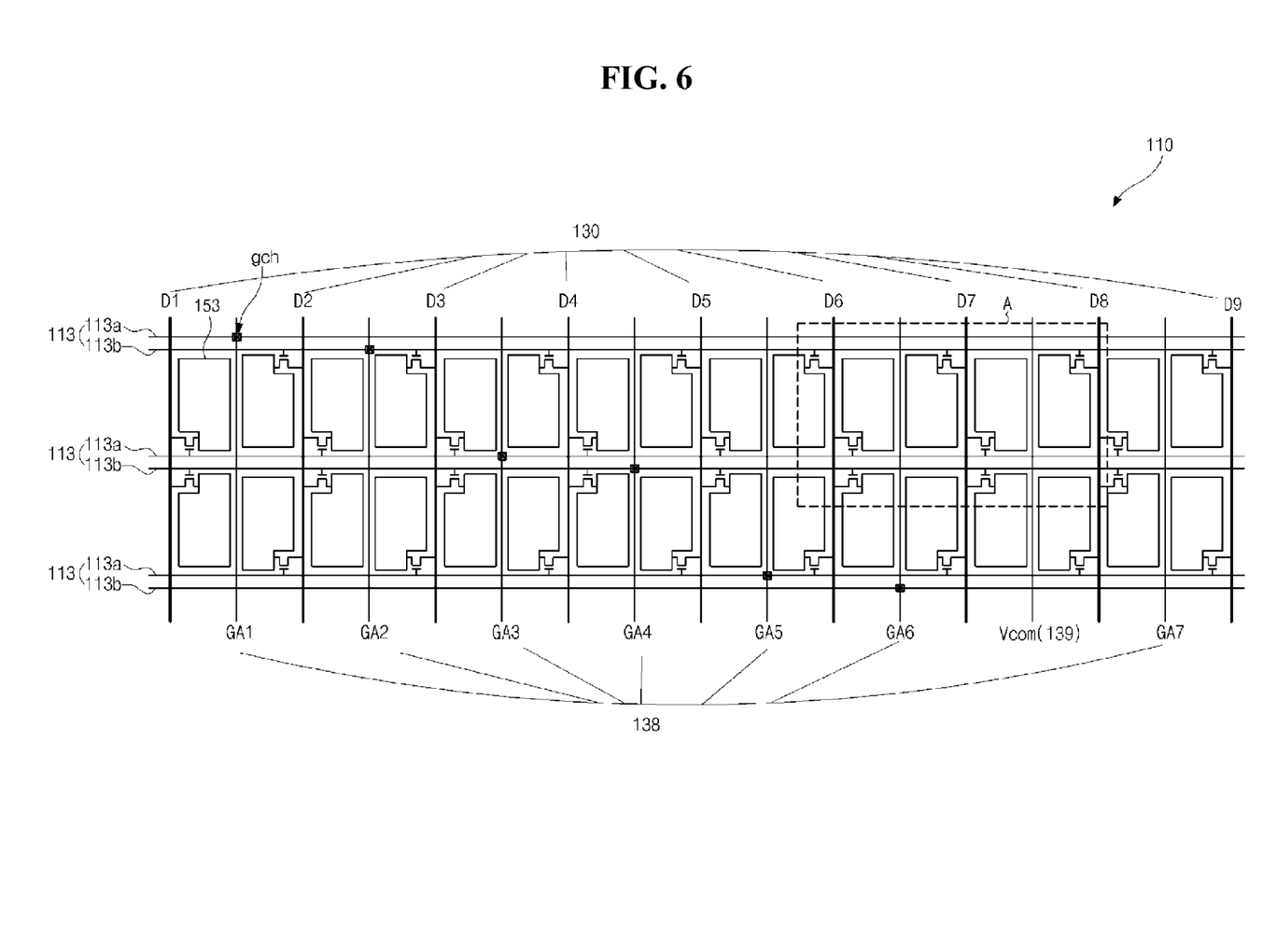
FIG. 6 is a plan view illustrating a portion of a display area of the array substrate of the LCD according to an embodiment.
Figure 7:
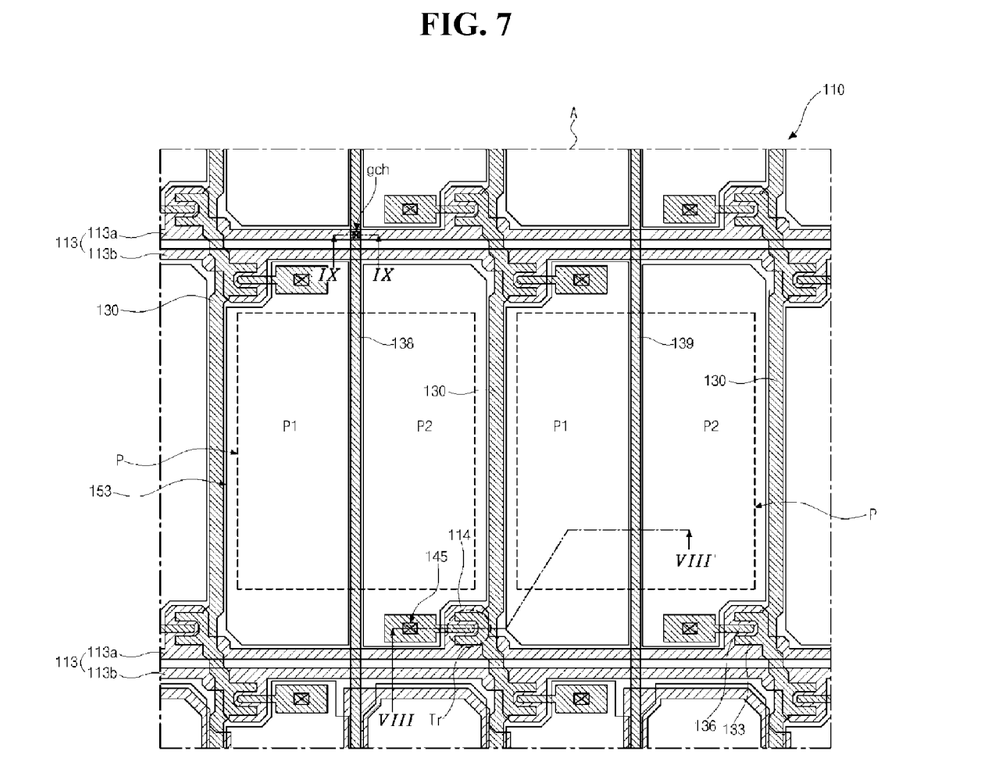
FIG. 7 is an enlarged view of region A of FIG. 6.

FIG. 6 is a plan view illustrating a part of a display area of the array substrate of the LCD according to an embodiment. FIG. 7 is an enlarged view of a region A of FIG. 6.

With reference to FIGS. 6 and 7, in the display area DA of the array substrate 110, a plurality of paired gate lines 113, which may each have first and second gate lines 113a and 113b spaced apart from each other at a first distance, may be spaced apart from one another at a second distance. The first distance may be selected to prevent a short-circuit in a patterning process, for example, about 2 µm to about 5 µm. The second distance may be greater than the first distance and may be substantially the same as a length of the pixels P1 and P2.

A plurality of data lines 130 may cross the paired gate lines 113 with a gate insulating layer therebetween in cross-section. A region P surrounded by the paired gate lines 113 and the data lines 130 crossing each other may include two adjacent pixel regions P1 and P2, and the region P may be referred to as a "first region P."

In each of the pixel regions P1 and P2, a thin film transistor Tr as a switching element may be formed. The thin film transistor Tr may include a gate electrode 114, a gate insulating layer, a semiconductor layer including an active layer (e.g., intrinsic amorphous silicon) and an ohmic contact layer (e.g., impurity-doped amorphous silicon), and source and drain electrodes 133 and 136 spaced apart from each other on the semiconductor layer. Alternatively, the thin film transistor Tr may include a gate electrode 114, a gate insulating layer, a oxide semiconductor layer, an etch stopper, and source and drain electrodes 133 and 136 spaced apart from each other on the etch stopper and contacting the oxide semiconductor layer.

In each of the pixel regions P1 and P2, a pixel electrode 153 connected to a drain electrode of the thin film transistor Tr may be formed. Although not shown in the drawings, a common electrode may be formed on or below the pixel electrode 153 with an insulating layer therebetween at the entire display area DA. In one example, one of the pixel electrode 153 and the common electrode located on the insulating layer may include a plurality of bar-shaped openings corresponding to each of the pixel regions P1 and P2, and a common line 139 may be connected to the common electrode. The pixel electrode 153 and the common electrode may induce a fringe field using the bar-shaped openings, and the fringe field operates liquid crystal. The gate electrode 114 may be connected to the corresponding one of the first gate line 113a and the second gate line 113b, and the source electrode 133 may be connected to the data line 130.

In one embodiment, a auxiliary gate line 138 or a common line 139 may be formed that is parallel with the data line 130 and may traverse a center portion of the first region P, for example, at a boundary between the pixel regions P1 and P2 of the first region P.

The auxiliary gate line 138 may be formed in the first region P while the common line 139 may be formed in another first region P. The auxiliary gate line 138 may contact a corresponding one of the gate lines 113 in the display area DA through a gate contact hole gch. A number of the auxiliary gate line 138 may be the same as, or may be an integer multiple of, a number of all gate lines 113 in the display area DA.

A plurality of auxiliary gate lines 138 may be grouped, and the common line 139 may be located between the adjacent groups of auxiliary gate lines 138. For instance, it is shown in the example drawings that six auxiliary gate lines 138 may form one group (e.g., GA1-GA6), and the common line 139 may be located between adjacent groups of six auxiliary gate lines 138.

Accordingly, presuming that the data lines 130 located from left to right are referred to as first to $n^{th}$ data lines D1 to Dn, and that the auxiliary gate lines located from left to right are referred to as first to $n^{th}$ auxiliary gate lines GA1 to GAn, an example sequence of lines may be as follows: a first data line D1, a first auxiliary gate line GA1, a second data line D2, a second auxiliary gate line GA2, a third data line D3, a third auxiliary gate line GA3, a fourth data line D4, a fourth auxiliary gate line GA4, a fifth data line D5, a fifth auxiliary gate line GA5, a sixth data line D6, a sixth auxiliary gate line GA6, a seventh data line D7, a common line 139 (Vcom), an eighth data line D8, a seventh auxiliary gate line GA7, and a ninth data line D9. This pattern may continue for as many data lines D and auxiliary gate lines GA as may be desired. Embodiments are not limited to this pattern. In addition, although the FIG. 6 example shows nine data lines D1-D9 and seven auxiliary gate lines GA1-GA7, embodiments are not limited thereto.

In addition, a number of the common lines 139 may be properly adjusted according to a number of auxiliary gate lines 138 forming a group thereof. Further, the common line 139 may not be located at regular positions, such as every n columns. For example, when a number of the auxiliary gate lines 138 is defined as an integer multiple of a number of the gate lines 113, positions between data lines 130 where the auxiliary gate lines 138 are located may be first determined, and then other positions between data lines 130 may be assigned to the common lines 139.

In the array substrate 110 described above, a region surrounded by the paired first and second gate lines 113a and 113b and the data line 130 may be defined as the first region P having the adjacent pixel regions P1 and P2. The auxiliary gate line 138 or the common line 139 may traverse the boundary of the adjacent pixel regions P1 and P2, and each of the pixel regions P1 and P2 may be surrounded and defined by the paired first and second gate lines 113a, 113b; the data line 130; and the auxiliary gate line 138 or the common line 139.

In the array substrate 110, the auxiliary gate line 138 may be formed, which may be connected to the corresponding gate line 113 along a horizontal direction and may be parallel with the data line 130. A gate voltage may be applied to the gate line 113 through the auxiliary gate line 138.

Further, as an end of the auxiliary gate line 138 may be located at the first non-display area NA1 at the top side of the array or the second non-display area NA2 at the bottom side of the array substrate 110 at an end of the data line 130, a gate pad may be formed at the top or bottom side of the array at the same non-display area where a data pad may be formed at the end of the data line 130.

Accordingly, a gate driving IC may be mounted for the gate pad formed at the same non-display area NA1 or NA2 as the data pad may be formed, or the PCB 190 may be connected to the non-display area NA1 or NA2 through a FPC including a combined gate/data driving IC processing a gate signal and data signal either separately or together.

Accordingly, for three of the non-display areas, other than the non-display area where the PCB 190 is installed, a driving IC may not be required to be installed or gate pad or data pad may not be required to be formed. Accordingly, widths of three of the non-display areas may be minimized, and the LCD can have a narrow bezel for three sides.

Further, in an example in which the PCB and the gate driving IC are installed for the opposite first and second non-display areas NA1, NA2, widths of the third and fourth non-display areas NA3, NA4 may be minimized, and the LCD may have a narrow bezel for the left and right sides.

The array substrate 110 may have twice as many gate lines and half as many data lines as the related art display device. Accordingly, as a number of the data lines decreases, a number of data driving ICs may decrease, and the auxiliary gate line 138 or the common line 139 may be formed at positions where the data lines of the related art are formed, and an aperture ratio of an embodiment may be substantially the same as the related art.

The LCD device according to an embodiment, in which the data line 130 may be formed every two pixel regions and the gate lines may be doubled, may be referred to as a "double rate drive (DRD)" type LCD.

Generally, the LCD of a related art device may display a color image using three pixel regions as a unit region. In other words, red, green, and blue emitted R, G, and B pixel regions forming the unit region may be mixed to display a color image.

Accordingly, a number of gate lines in a related art device is three times greater than a number of data lines. Further, as the related art LCD device may have a ratio of width to height of display area of 5:4 to 16:9, a number of pixel regions in a horizontal direction may be 1.25 times or more the number of pixel regions in a vertical direction. Accordingly, in the related art LCD, a number of gate lines may be 3.75 times or more the number of data lines.

In an embodiment, a number of gate lines may increase to double that of the related art LCD device, and a number of data lines may be reduced to half that of the related art LCD device.

Accordingly, presuming that a number of gate lines of the related art LCD device is 1, a number of gate lines of an embodiment may be 2 and a number of data lines of an embodiment may be 1.875 (=3.75/2). Accordingly, embodiments may use 1.875 times fewer gate lines.

A portion of the spare positions may be assigned as positions for the auxiliary gate lines 138 having the same number as gate lines 113, and a remaining part of the spare positions, other than the positions assigned to the auxiliary gate lines 138, may be assigned as positions for the common lines 139.

In case of a full-HD (high definition) resolution, e.g., 1080×1920 unit regions (each having 3 pixel regions), 1080 gate lines and 5760 (=1920×3) data lines are formed for a related art LCD device. However, in an embodiment using the DRD type LCD having the full-HD resolution, 2160 (=1080× 2) gate lines and 2880 (=1920×3/2) may be formed.

Accordingly, in comparison to the related art LCD device, a number of the data lines 130 may be reduced by 2880, such that 2880 fewer positions for data lines 130 may be used. In one example, the auxiliary gate lines 138 may be formed at 2160 positions (some of which may be a number of gate lines 113) out of 2880 spare positions, and the common lines 139 may be formed at the remaining 720 positions (=2880−2160 positions) out of the 2880 spare positions.

As described above, even though a number of gate lines of this embodiment may increase to double the number of gate lines of the related art LCD device, as an increasing number of gate lines 113 may be greater than a decreasing number of data lines 130, enough positions to form auxiliary gate lines 138 (which may be configured to correspond to gate lines 113) respectively, may be obtained.

According to the above configuration, the LCD according to an embodiment may have a narrow bezel at the two or three non-display areas out of the four non-display areas surrounding the display area. Further, even though the auxiliary gate lines may be formed at the display area, as a number of data lines decreases and as auxiliary gate lines are formed at positions left due to the decrease of the data lines, reduction of aperture ratio may be prevented.

Figure 8:
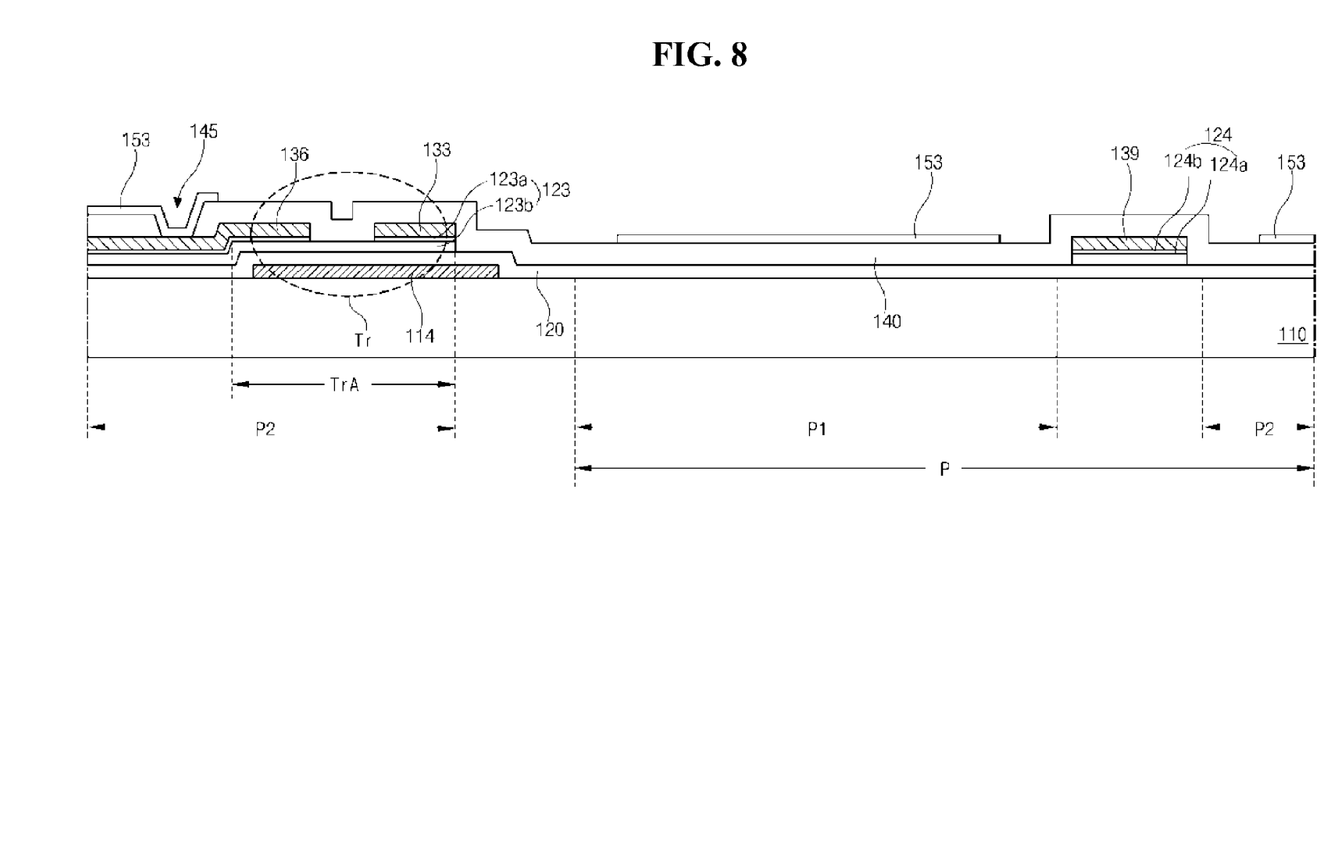
FIG. 8 is a cross-sectional view taken along line VIII-VIII' of FIG. 7.
Figure 9:
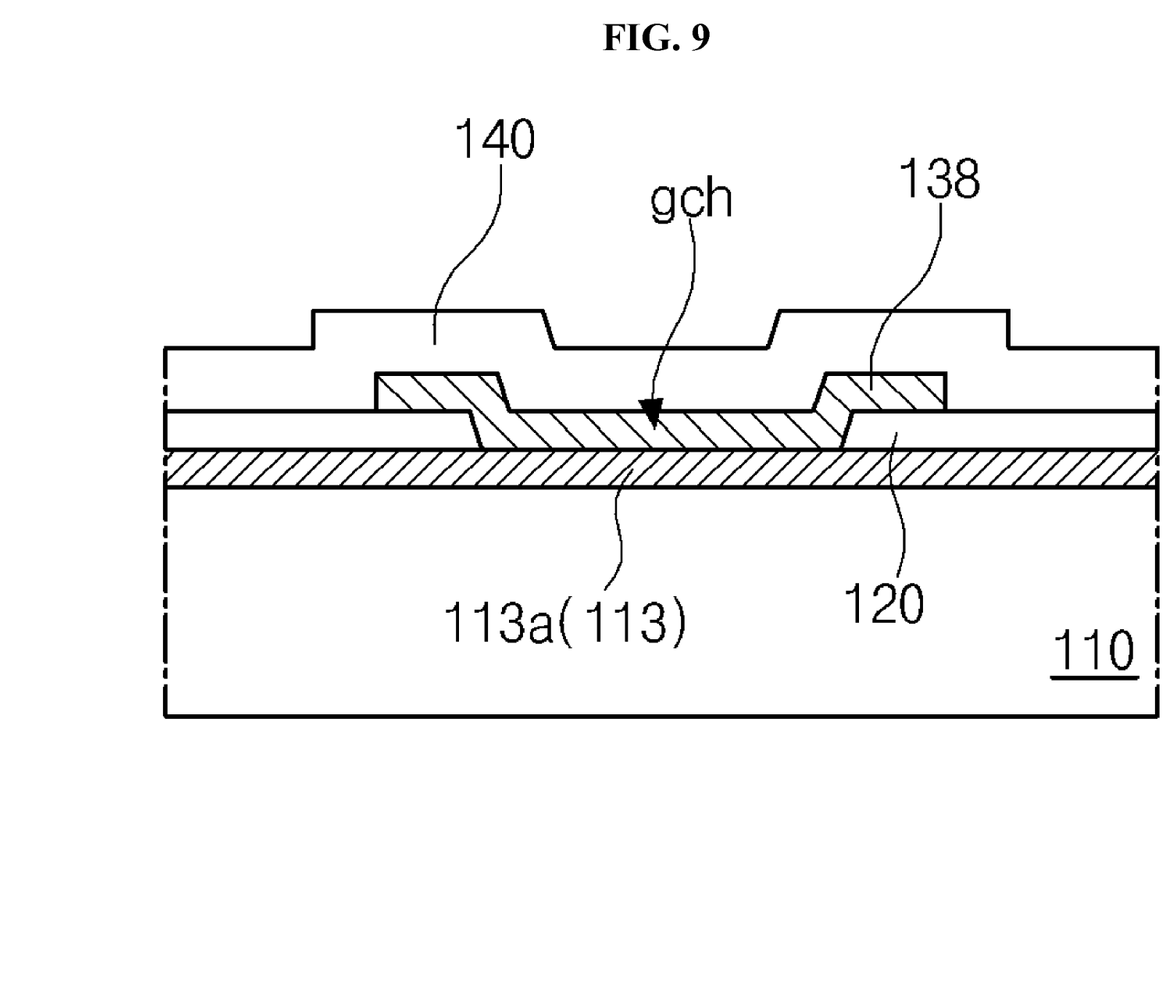
FIG. 9 is a cross-sectional view taken along line IX-IX' of FIG. 7.

FIG. 8 is a cross-sectional view taken along line VIII-VIII' of FIG. 7. FIG. 9 is a cross-sectional view taken along line IX-IX' of FIG. 7. In the example drawings, a switching area TrA is defined in which a thin film transistor Tr is formed in each of pixel regions P1 and P2.

The plurality of paired gate lines 113 may be spaced at the second distance among one another. Each of the plurality of paired gate lines 113 may have the first gate line 113a and the second gate line spaced at the first distance from each other and parallel with each other. The gate line 113 may be formed of a low resistance material, for example, at least one of aluminum (Al), aluminum alloy (e.g., AlNd), copper (Cu), copper alloy, molybdenum (Mo), and molybdenum alloy (e.g., MoTi).

The gate electrode 114 may be formed at the switching area (TrA) and may extend from each of the first gate line 113a and the second gate line.

The gate insulating layer 120 may be formed on the gate line 113 and the gate electrode 114, and may be made of an inorganic insulating material, for example, silicon oxide ($SiO_2$) and/or silicon nitride ($SiN_x$). The gate insulating layer 120 may have the gate contact hole gch exposing a part of each of the first gate line 113a and the second gate line. Each gate contact hole gch may be formed corresponding to each auxiliary gate line 138 connected to the corresponding gate line 113.

The semiconductor layer 123 may be formed at the switching area TrA and may include the active layer 123a (made of, for example, intrinsic amorphous silicon), and an ohmic contact layer 123b (made of, for example, impurity-doped amorphous silicon) on the active layer 123a. The source and drain electrodes 133 and 136 may be spaced apart from each other on the semiconductor layer 123.

The gate electrode 114, the gate insulating layer 120, the semiconductor layer 123, and the source and drain electrodes 133 and 136 at the switching area TrA may form the thin film transistor Tr. The source electrode 133 may extend from the data line 130.

The data line 130 may be formed at the boundary of the first region P on the gate insulating layer 120 and may cross the gate line 113. The data line 130 may be made of a low resistance material, for example, at least one of aluminum (Al), aluminum alloy (e.g., AlNd), copper (Cu), copper alloy, molybdenum (Mo), and molybdenum alloy (e.g., MoTi). The auxiliary gate line 138 or the common line 139 may be formed on the at the boundary between the pixel regions P1 and P2 alternating with the data line 130, and may be made of, for example, the same material as the data line 130.

The position and arrangement of the auxiliary gate line 138 and the common line 139 are explained in detail as above.

The auxiliary gate line 138 may contact the corresponding gate line 113 through the gate contact hole gch.

In the example drawings, it is shown that a semiconductor pattern 124 (made of, for example, the same material as the semiconductor layer 123) may be formed below each of the data line 130, the auxiliary gate line 138 and the common line 139. The semiconductor pattern 124 may include the active layer 124a (e.g., intrinsic amorphous silicon), and an ohmic contact layer 124b (e.g., impurity-doped amorphous silicon) on the active layer 123a. Alternatively, the semiconductor pattern 124 may be omitted.

Further, in an embodiment, the semiconductor layer 123 may have the double-layered structure of the active layer 123a and the ohmic contact layer 123b. Alternatively, the semiconductor layer 123 may be a single-layered oxide semiconductor layer that may be made of, for example, IGZO (indium gallium zinc oxide), ZTO (zinc tin oxide), and/or ZIO (zinc indium oxide).

In one example, the semiconductor pattern 124 below the data line 130, the auxiliary gate line 138, and the common line 139 may be omitted, and an etch stopper may be formed on a center portion of the oxide semiconductor layer.

The passivation layer 140 may be formed on the thin film transistor Tr, the data line 130, the auxiliary gate line 138, and the common line 139. The passivation layer 140 may be made of an inorganic insulating material, e.g., silicon oxide (SiO2) and/or silicon nitride (SiNx), and/or an organic insulating material, e.g., benzocyclobutene (BCB) and/or photo acryl.

The passivation layer 140 may include a drain contact hole 145 exposing the drain electrode 136, and a common contact hole (not shown) exposing the common line 139.

The pixel electrode 153 may be formed in each of the pixel regions P1 and P2 on the passivation layer 140 and may contact the drain electrode 136 through the drain contact hole 145. The pixel electrode 153 may be made of a transparent conductive material, for example, ITO (indium zinc oxide) and/or IZO (indium zinc oxide).

When the fringe field switching mode LCD is used, an insulating layer may be formed on the pixel electrode 153, and a common electrode made of the transparent conductive material, for example, ITO (indium zinc oxide) and/or IZO (indium zinc oxide), may be formed on the insulating layer.

In one example, the insulating layer may include the common contact hole along with the passivation layer 140 to expose the common line 139, and the common electrode may include bar-shaped first openings corresponding to the pixel electrode 153 and a second opening corresponding to the switching area TrA.

The common electrode may contact the common line 139 through the common contact hole of the passivation layer 140 and the insulating layer.

As described above, in the array substrate according to an embodiment, the gate pad portion may be formed on the non-display area at the top or bottom side of the display area. Accordingly, widths of the left and right non-display area may be minimized and a narrow bezel may be achieved there.

Further, even though the auxiliary gate lines may be formed at the display area, as a number of data lines may decrease and auxiliary gate lines may be formed at positions remaining due to the decrease of the number of the data lines, reduction of aperture ratio may be prevented.

It should be appreciated that the top, bottom, left, and right non-display area configurations may be interchangeable. For example, the top and bottom sides of the display area may be minimized, or any of the four. Other geometrical arrangements may be used; embodiments are not limited to a four-sided shape.

Although embodiments have been described with reference to a number of illustrative embodiments thereof, it should be understood that numerous other modifications and embodiments may be devised by those skilled in the art that will fall within the spirit and scope of the principles of this disclosure. For example, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An array substrate for a display device, comprising:
a plurality of paired gate lines spaced at a first distance from each other, each pair of gate lines being located at a corresponding boundary between adjacent first regions on a substrate, the substrate comprising a display area comprising a plurality of first regions, each of the first regions comprising two pixel regions adjacent to each other;
a gate insulating layer on the gate lines and comprising a gate contact hole configured to expose each of the gate lines;
a plurality of data lines crossing the paired gate lines, such that the first regions are located at each crossing;
an auxiliary gate line parallel with the data lines and at a boundary between the adjacent two pixel regions;
a thin film transistor in each of the pixel regions and connected to corresponding gate and data lines; and
a common line parallel with the data lines and entirely within another boundary between two adjacent pixel regions of another first region,
wherein the auxiliary gate line contacts the corresponding gate line through the gate contact hole, and
wherein a number of the auxiliary gate lines is n times a number of the gate lines, where n is an integer greater than or equal to 2.

2. The array substrate of claim 1, wherein:
a data pad is located at an end of the data line and at:
a non-display area at a top side of the display area; or
a non-display area at a bottom side of the display area; and
a gate pad is located at an end of the auxiliary gate line and at:
the non-display area at the top side of the display area; or
the non-display area at the bottom side of the display area.

3. The array substrate of claim 2, wherein the data pad and the gate pad are located at a same non-display area.

4. The array substrate of claim 2, further comprising:
a gate driving integrated circuit (IC) connected to the gate pad; and
a PCB connected to the data pad through a flexible printed circuit (FPC) comprising a driving IC.

5. The array substrate of claim 1, further comprising:
a passivation layer on the thin film transistor and the data line; and
a pixel electrode in each of the pixel regions and connected to the thin film transistor.

6. The array substrate of claim 5, further comprising:
an insulating layer on the pixel electrode; and
a common electrode on the insulating layer and comprising bar-shaped openings corresponding to the pixel electrode,
wherein the passivation layer and the insulating layer comprise a common contact hole exposing the common line, and
wherein the common electrode contacts the common line through the common contact hole.

7. The array substrate of claim 1, wherein there is one common line for every n auxiliary gate lines.

8. A method of manufacturing an array substrate for a display device, the method comprising:
providing a plurality of paired gate lines spaced at a first distance from each other, each pair of gate lines being provided at a corresponding boundary between adjacent first regions on a substrate, the substrate comprising a display area comprising a plurality of first regions, each of the first regions comprising two pixel regions adjacent to each other;
providing a gate insulating layer on the gate lines and comprising a gate contact hole exposing each of the gate lines;
providing a plurality of data lines crossing the paired gate lines, such that the first regions are located at each crossing;
providing an auxiliary gate line parallel with the data lines and at a boundary between the adjacent two pixel regions;

providing a thin film transistor in each of the pixel regions and connected to corresponding gate and data lines; and providing a common line parallel with the data lines and entirely within another boundary between two adjacent pixel regions of another first region, wherein the auxiliary gate line contacts the corresponding gate line through the gate contact hole, and wherein a number of the auxiliary gate lines is n times a number of the gate lines, where n is an integer greater than or equal to 2.

9. The method of claim 8, further comprising:
providing a data pad at an end of the data line and at:
   a non-display area at a top side of the display area; or
   a non-display area at a bottom side of the display area; and
providing a gate pad at an end of the auxiliary gate line and at:
   the non-display area at the top side of the display area; or
   the non-display area at the bottom side of the display area.

10. The method of claim 9, wherein the data pad and the gate pad are provided at the same non-display area.

11. The method of claim 9, further comprising:
providing a gate driving integrated circuit (IC) connected to the gate pad; and
providing a PCB connected to the data pad through a flexible printed circuit (FPC) comprising a driving IC.

12. The method of claim 8, further comprising:
providing a passivation layer on the thin film transistor and the data line; and
providing a pixel electrode in each of the pixel regions and connected to the thin film transistor.

13. The method of claim 12, further comprising:
providing an insulating layer on the pixel electrode; and
providing a common electrode on the insulating layer and comprising bar-shaped openings corresponding to the pixel electrode, wherein the passivation layer and the insulating layer comprise a common contact hole exposing the common line, and wherein the common electrode contacts the common line through the common contact hole.

14. The method of claim 8, wherein there is one common line for every n auxiliary gate lines.

* * * * *